United States Patent [19]

Cusano

[11] Patent Number: 4,909,895

[45] Date of Patent: Mar. 20, 1990

[54] SYSTEM AND METHOD FOR PROVIDING A CONDUCTIVE CIRCUIT PATTERN UTILIZING THERMAL OXIDATION

[75] Inventor: Dominic A. Cusano, Schenectady, N.Y.

[73] Assignee: Pacific Bell, San Francisco, Calif.

[21] Appl. No.: 336,868

[22] Filed: Apr. 11, 1989

[51] Int. Cl.[4] .................. B44C 1/22; C23F 1/02; C03C 15/00; C03C 25/06
[52] U.S. Cl. ................... 156/643; 156/652; 156/659.1; 156/666; 156/902; 156/345; 219/121.69; 219/121.85; 427/53.1; 427/96
[58] Field of Search ............ 156/643, 652, 656, 659.1, 156/666, 902, 345; 219/121.68, 121.69, 121.85; 427/53.1, 96; 174/68.5; 428/601, 209

[56] References Cited

U.S. PATENT DOCUMENTS 4,622,095 11/1986 Grobman et al. ............... 156/666 X
4,834,834 5/1989 Ehrlich et al. ..................... 156/643

*Primary Examiner*—William A. Powell
*Attorney, Agent, or Firm*—McCubbrey, Bartels, Meyer & Ward

[57] ABSTRACT

A system and method for improved conductive circuit patterning utilizing laser ablation is disclosed. In an embodiment, a substrate, which has an electroless conductive layer plated thereon, is heated to a predetermined temperature for a predetermined time to form an oxide layer upon the conductive layer. The oxide layer, due to its non-absorptive properties, is more easily ablated than the conductive layer. Hence, the overall processing time for circuit patterning is significantly reduced.

24 Claims, 5 Drawing Sheets

SYSTEM AND METHOD FOR PROVIDING A CONDUCTIVE CIRCUIT PATTERN UTILIZING THERMAL OXIDATION

FIELD OF THE INVENTION

The present invention relates to the electroless plating of metals and, more specifically, to techniques in which the pattern of the plated metal is determined by laser processing.

BACKGROUND OF THE INVENTION

There are a number of applications in which conductive materials must be selectively applied to the surface of an insulating substrate. One example is printed circuit boards that have conductive lines plated thereon. These conductive lines may be fabricated by bonding a metallic strip to the base member; however, it is preferred that the lines be plated directly on the insulating base member material.

There are a number of known techniques for the electroless plating of metal on insulating substrates. The processes are referred to as electroless because they do not require that an electrical current be passed through the object being plated.

Among these prior art techniques are methods utilizing ultraviolet light to selectively patter metal onto an insulating substrate. Typically, the spatial distribution of the plated metal on the surface of the substrate is determined by exposing the surface to ultraviolet light after coating the surface with a catalyst, referred to as a photo-promoter. The plating methods are often grouped into "positive" and "negative" methods. Positive methods are those methods in which metal will be plated in those regions exposed to the ultraviolet light. Negative methods are those methods in which metal will be deposited in those regions which are not exposed to the ultraviolet light.

De Angeleo, et al. (U.S. Pat. No. 3,562,005) describe a method for selectively patterning metal onto an insulating substrate. In the method described by De Angeleo, et al., a photo-promoter such as stannous chloride is used as a photosensitive catalyst. In this procedure, a stannous chloride solution is applied to the surface of the material to be plated. The portions of the surface which are not to be plated are then exposed to ultraviolet light having a wavelength less than 300 nm. Following the exposure to the ultraviolet light, the surface is exposed to a salt of a precious metal, e.g., palladium chloride. In those areas which were not exposed to the ultraviolet light, the following reaction takes place:

$$SnCl_2 + PdCl_2 \rightarrow SnCl_4 + Pd \quad (1)$$

The areas which were exposed to the ultraviolet light show no palladium formation, since the absorbed stannous chloride is photochemically oxidized to stannic chloride. Stannic ions cannot reduce the palladium ions in the palladium chloride to metallic palladium. Once the metallic palladium layer is formed, other metals may be plated onto the locations covered by the palladium using conventional plating techniques. De Angeleo, et al. describe processes based on the precious metals palladium, platinum, gold, silver, osmium, indium, iridium, rhenium, and rhodium.

Although these processes work effectively for their intended purposes, they do have some deficiencies. For example, it is very important in these processes that the catalyst be carefully patterned onto the substrate surface. Sometimes the catalyst is inadvertently applied in an area that should not contain metal. In addition, the conductive lines produced utilizing these processes oftentimes do not have the strength necessary for use in a printed circuit board.

One alternative process employs a laser beam for forming the conductive circuit pattern. In this process, a metal layer is applied covering the entire substrate surface. This layer is then patterned by selectively removing the metallization in predetermined regions. The metal is removed using a laser.

The metal layer may be applied to the substrate using any of a number of processes. For example, the substrate may be coated with $SnCl_2$ and then immersed in a $PdCl_2$ bath. This results in a layer of metallic Pd being deposited on the surface of the substrate. After the precious metal layer is applied to the substrate, the layer is patterned by utilizing a laser beam to remove the metal layer. Thereafter, conductive metal lines ar plated on the patterned metal layer in accordance with known techniques.

Typically, $CO_2$ or YAG lasers are utilized to thermally vaporize the metal layer in the areas of the substrate that are to be devoid of metal. These laser processes, although effective for many purposes, are oftentimes not as precise or reliable as needed when patterning conductive lines for a printed circuit board. The above-mentioned types of laser processes rely on heat for cutting through the material to be processed. Hence, the processes depend on relatively long wavelength light which can be difficult to control in providing minimum depth cuts in a material.

More particularly, in providing conductive lines on the substrate surface, as before mentioned, the plated metal (such as palladium) on the substrate is very thin, on the order of 10 to 40 angstroms. Thus, it is very important that the laser penetrate the metal layer a very short distance to avoid degradation of the substrate. The above-mentioned processes are difficult to control to these depths. In addition, these processes leave a large percentage of their energy in the substrate due to thermal activity. In so doing, the area surrounding the processed portion of the substrate is damaged by the thermal effects. Hence, the above-mentioned laser processes are not as effective as desired when a small area is to be patterned.

Excimer lasers are finding increasing use as an alternative to the above-mentioned laser processes for the selective patterning of a metal layer that is on the surface of an insulating substrate. Excimer lasers produce relatively short wavelength light, such as in the ultraviolet range Excimer lasers typically operate at wavelength of 180 to 370 nm at 50 to 200 millijoules of power. Of particular importance to this process is that excimer lasers remove material by ablation rather than by melting or vaporization.

In many cases, this ablative mechanism results in a higher degree of precision than can be achieved through other types of laser processes. What is meant by the ablative mechanism in this application is that when an ultraviolet light of sufficient energy irradiates a surface, the energy interacts with the material of the surface and results in the decomposition and ejection of the surface layer.

Although a detailed understanding of the complex ablative mechanisms has yet to be developed, all recent theories agree on the following two points: (1) The ablative material is removed layer by layer on a pulse-by-pulse basis of the excimer laser; and (2) the majority of the energy in the laser pulse is used in bond breaking and ejecting ablative material from the substrate. Consequently, very little energy remains in the substrate and the thermal diffusion to surrounding areas is greatly reduced.

The physical mechanism of ablation differs markedly from the thermal mechanisms of other laser processes for material removal. Hence, excimer lasers offer new capabilities in the area of electroless plating.

The ablative mechanism gives rise to several characteristics which are unique to excimer laser operation. First, the materials can be removed with extremely high precision and excellent edge definition. Second, there is significantly less charring or burning of the surrounding material. Third, there is a minimum heat effective zone, that is, there would be little if any distortion of the substrate using the laser. Finally, the definition of patterns by mask imaging can be done by irradiating the total surface of the substrate rather than by translation of a focused spot of the laser beam along a trajectory on the substrate surface, as used in non-ablative laser processing. Thus, an entire area on the substrate can be processed at once.

Another key feature of the excimer laser processing technique is that the absorption of the energy occurs within a localized region near the surface of the irradiated material. Therefore, there is little opportunity for thermal diffusion to the surrounding material. Consequently, the exposed material can be removed while the underlying material is left virtually untouched, even in the case of very thin layers of metal.

Although in principle this can also be achieved using $CO_2$ or other type lasers, in practice, the thermal nature of conventional laser processing will ultimately do considerable destruction to the remaining substrate. Hence, the use of excimer lasers for patterning a substrate which has a thin metal layer plated thereon provides clear advantages over other types of laser processing techniques.

However, a particular problem with laser ablation processing is that a residue comprising some substrate surface material and the ablated thin metal layer lands on the unablated regions of the surface of the substrate. This residue on the substrate surface presents a particular problem in that it is not easily removed. Although an excimer laser does not generate the large quantity of heat of above-described laser processes, there is some heat generated at the metal/substrate interface in the region where the laser beam strikes the plated substrate. This gives rise to a molten mass of material, hereinafter referred to as residue, which, after being explosively removed from the substrate, lands back in the substrate due to gravity and then adheres to the surface after cooling. It is virtually impossible to remove the residue without marring the thin metal layer on the surface of the substrate.

Hence, no attempt is usually made to remove the residue because to do so would adversely affect the underlying circuit pattern. However, by not removing the residue, the quality and integrity of the circuit pattern is also compromised. It is known that the subsequent electrodeposition process for conductive line patterning requires that the thin metal layer be free from impurities. The presence of the residue represents an impurity that affects the integrity and quality of the conductive lines.

Since there may be thousands of these circuit patterns utilized in conjunction with certain applications, it is important to provide a reliable and effective method and apparatus for ensuring that the highest quality conductive circuit pattern possible is obtained when utilizing the ablative laser process.

A system for removing the residue created by excimer laser processing is described in copending U.S. Patent Application , entitled *Improved Method and Apparatus for Providing a Conductive Circuit Pattern*, U.S. Ser. No. 265,020, filed Oct. 31, 1988 and assigned to the assignee of the present invention. The system of the above-cited application utilizes a barrier material on the substrate. The barrier material is easily ablated away by the excimer laser as well as being removable from the substrate to allow for the carrying away of the residue. This process effectively removes the residue from the substrate and provides for either a patterned catalyst layer or a patterned electroless conductive layer for subsequent electrodeposition.

It has also been described in the aboveidentified patent application that by providing a conductive layer of copper and thereafter ablating this layer in the desired pattern, the pull strength of the resultant electroplated copper lines is significantly enhanced.

However, the excimer laser process, although requiring low power, is oftentimes slowed due to the highly reflective surface of the shiny copper. Consequently, the cycle time of the laser processing can be significantly increased. This in turn affects the feasibility of the process in a manufacturing process in that the process may not be as cost-effective as competing processes. Accordingly, any means for decreasing the ablative laser processing time in the patterning of a conductive circuit layer, while at the same time maintaining the advantages of the above-identified copending patent application, represents a significant advance in the art.

Broadly, it is an object of the present invention to provide an improved system and method for conductive circuit patterning utilizing laser ablation.

It is a further object of the present invention to provide a system and method for removing the residue associated with ablative laser processing techniques.

It is also an object of the present invention to provide a system and method that produces strengthened conductive lines compared to those lines produced by previously known ablative laser techniques.

It is also an object of the present invention to provide a system and method for conductive circuit patterning utilizing the laser ablation process that decreases the overall processing time.

These and other objects of the present invention will become apparent to those skilled in the art from the accompanying detailed description.

SUMMARY OF THE INVENTION

The present invention comprises a system for patterning a metallic layer affixed to a surface of an insulating substrate. The system includes providing an oxidelayer on the surface of the metallic layer that is opposite the substrate surface. The oxide layer is of sufficient thickness to substantially reduce the reflectivity of the metallic layer. A reduction in reflectivity of at least 10% is needed; however, a reduction of 15% or more is preferred. The system also includes exposing predetermined regions of the metallic layer to an ablative laser beam and thereafter removing the oxide layer.

In accordance with a second embodiment of the present invention, an additional barrier material is utilized prior to te laser processing to further protect the surface from residue.

In the first embodiment, the oxide layer is formed on the metallic layer, which, due to its nonreflective surface, is easier to ablate than the shiny electroless conductive surface. Thereafter, an acid solution can preferably be utilized to remove the oxide layer.

In the second embodiment, the additional barrier material also acts as a shield upon which the residue created by he interaction of the laser beam with the substrate can land.

In a preferred embodiment, the barrier material is an organic material which exhibits the above-mentioned characteristics. In this case, the residue is "lifted off" with the material when a rinsing agent such as a mild solvent is applied to the substrate. The oxide layer can thereafter be removed as before described.

Accordingly, the present invention provides an improved method and apparatus for providing the conductive circuit patterns utilized for printed circuit board fabrication.

BRIEF DESCRIPTION OF THE DRAWINGS

The advantages of the present invention will become more apparent from the following detailed description and the drawings in which.

DETAILED DESCRIPTION

Figure 1:
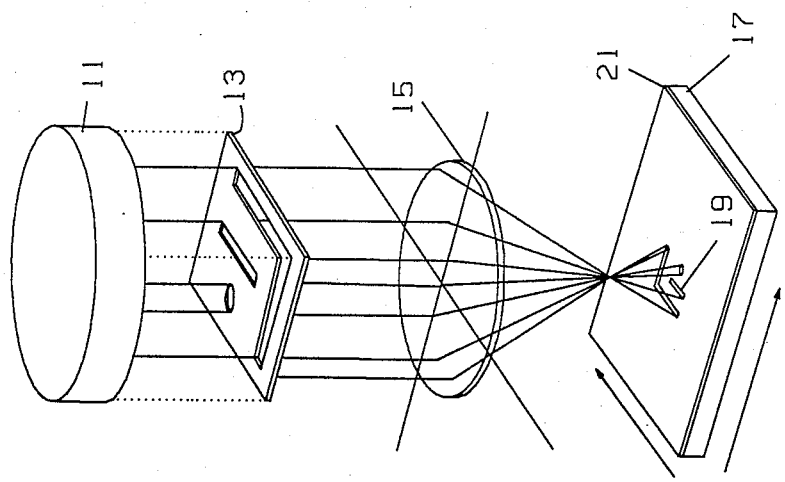
FIG. 1 is a pictorial perspective view of the laser ablation process of the prior art.

The present invention will be better understood by first referring to a typical prior art laser ablation apparatus shown in FIG. 1. FIG. 1 depicts a typical optical arrangement utilized in an excimer laser ablation process. The optical arrangement comprises an excimer laser 11, a mask 13, a lens 15, and a substrate 17. The substrate 17 is typically comprised of a plastic, such as Ultem TM polytherimide. Alternatively, the substrate can be of a glass composition. As has been before mentioned, the substrate 17 has a very thin layer (10–40 angstroms) of precious metal 21, such as palladium, affixed thereto by dipping the substrate 17 in a bath of a salt of the precious metal after coating the substrate with stannous chloride or other suitable promoter.

A mask 13 provides a pattern 19 on the substrate 17 which defines the circuit pattern. The mask 13 is typically a metal which is substantially impervious to the ablative process. The mask pattern 19 is relayed onto the substrate 17 by the lens 15. When the laser beam 10 from the excimer laser 11 is activated, the mask pattern 19 is reproduced on the substrate 17.

When the laser hits the thin metal layer 21 on the substrate 17, the radiation penetrates to the metal/substrate interface and produces a pressure build-up at the interface. The pressure build-up is the result of the decomposition of the substrate 17, in the case of polymeric materials, or of degassing, in the case of glass. The crucial parameter controlling the effectiveness of metal removal is the ability of this pressure build-up to explosively remove the metal.

As before mentioned, this explosive force ejects both the thin metal layer 21 and a thin layer of the substrate 17 from the metal/substrate interface. These ejected materials form a residue that lands on the substrate surface. The residue is molten due to a heat build-up at the point of laser beam contact; thus, when it lands on the surface of the patterned substrate, it adheres to the substrate upon cooling.

To attempt to remove the residue would be very difficult. Since the metal layer is thin, any attempt to remove the residue would also probably mar or scratch away some of the metal. In so doing, the integrity and quality of the conductive pattern deposited thereon would be adversely affected. Hence, the residue is typically left on the substrate during the subsequent electrodeposition process.

However, the residue also adversely affects the quality and integrity of the subsequent electrodeposition process. For example, it is known that the thin metal layer should be clean as possible to allow for proper electrodeposition to take place. Hence, the residue located on the patterned surface of the metal layer represents an impurity that will interfere with the electrodeposition process.

Therefore, the strength and integrity of the subsequent electroplated conductive lines on a printed circuit board are reduced by the presence of the residue. If the ablation process is to be utilized effectively in a manufacturing process, it is very important that the patterned layer produced thereby be free from impurities to ensure that the subsequent electrodeposition process provides the highest quality circuit pattern.

As has been before described, in a copending U.S. patent application, entitled *Improved System and Method for Providing a Conductive Circuit Pattern,* U.S. Ser. No. 265,020, filed Oct. 31, 1988 a barrier material is placed on a substrate that has a metal layer thereon. In so doing, the residue can be effectively removed when the barrier material is removed. This system substantially increases the strength and integrity of the conductive lines.

Previous laser ablation processes have a second problem. It is known that, due to the highly reflective surface of the metal layer, the cycle time of the ablative laser process is increased. Hence, any method or apparatus which would decrease the cycle time of the laser process while still retaining the advantages of the above-described copending U.S. patent application represents a significant advance in the art.

Figure 2:
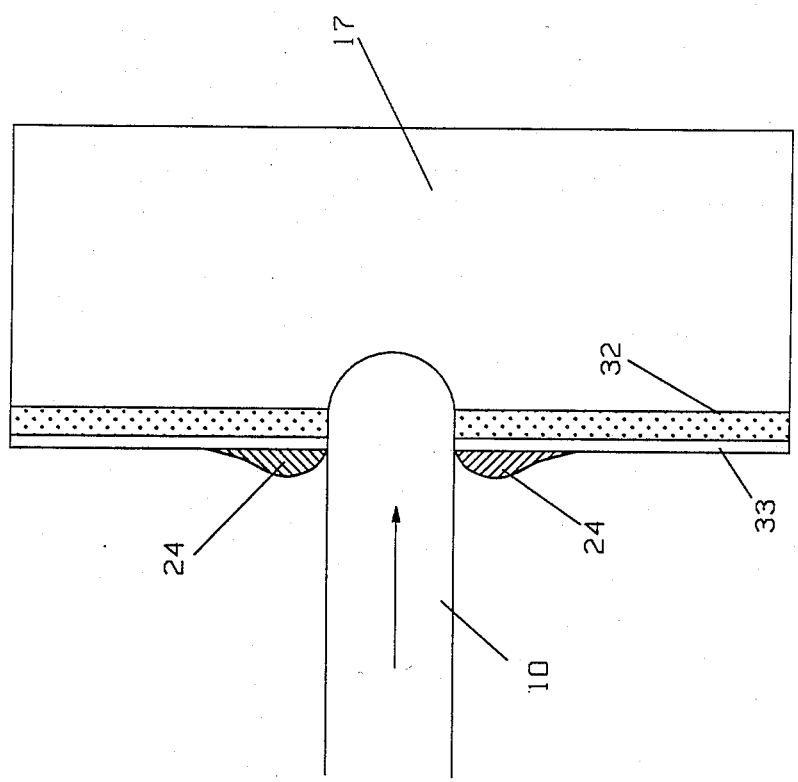
FIG. 2 is a cross-sectional side view of a substrate patterned in accordance with one embodiment of the present invention.

Refer now to FIG. 2, which is a side cross-sectional view of a substrate that has been treated in accordance with a first embodiment of the present invention. It should be noted that the thicknesses of the various layers on the substrate 17 have been exaggerated for illustrative purposes to add clarity to the following explanation.

In this figure, the substrate 17, which includes an electroless conductive layer 32 deposited thereon, is covered by an oxide layer 33. The oxide layer 33 is formed by heating the substrate 17 to a predetermined temperature for a predetermined time.

The substrate 17 is then bombarded by the ablation laser beam. The oxide layer 33 is of sufficient thickness to substantially reduce the reflectivity of the conductive layer 32. Hence, the ablative laser beam more easily removes the conductive layer 32, due to the nonreflective properties of the oxide layer 33. For example, it has been found that by providing a copper oxide layer 33 on the substrate 17 for a typical printed circuit board, the ablative laser beam can operate 200% faster to pattern the substrate 17 than if no oxide layer is located thereon.

A residue 24 from the laser process representing the metal/substrate interface is then deposited on the oxide layer 33 in the non-ablated areas. The oxide layer 33 i subsequently removed from the substrate 17 while also lifting off the residue 24. Hence, what is provided is a patterned substrate 17 with substantially no impurities thereon.

The oxide layer 33 can be removed by an acid solution. For example, if the conductive metal layer 32 is copper, the copper oxide layer 33 can be easily removed by rinsing the substrate 17 in an aqueous $H_2SO_4$ solution. The residue 24 deposited thereon is washed away with the oxide layer 33.

Figure 3:
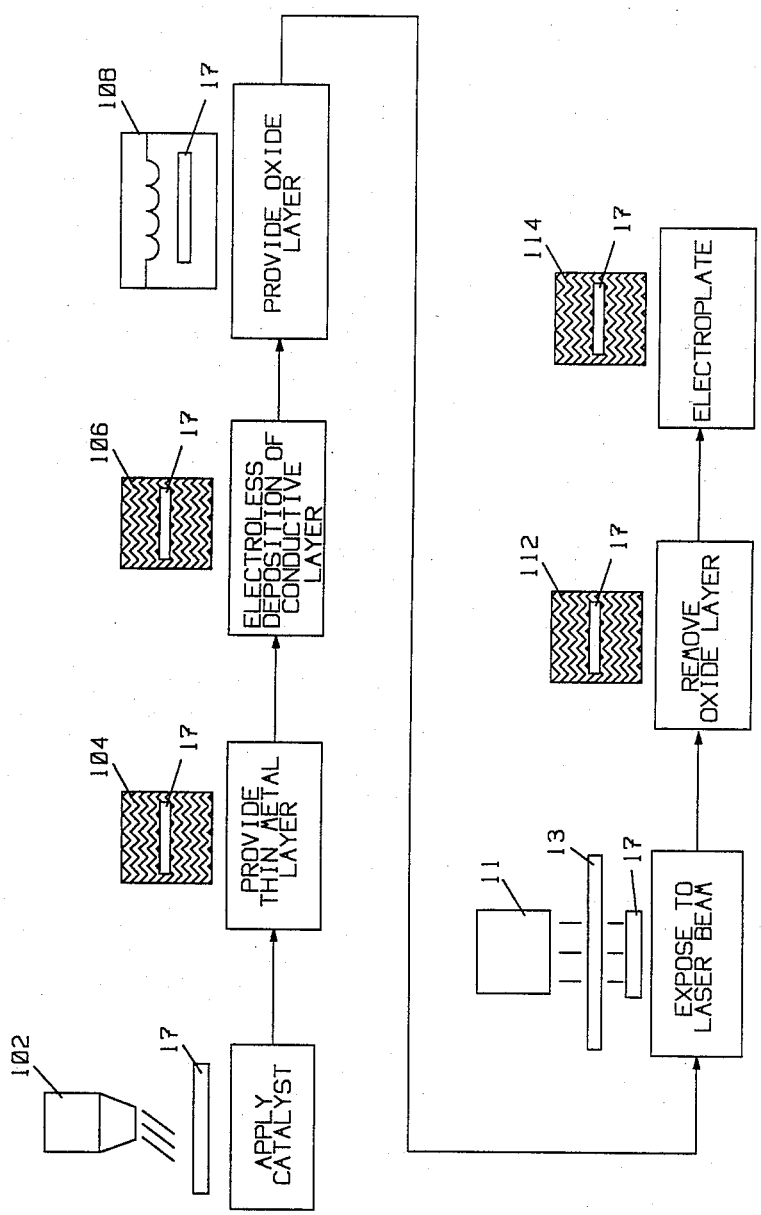
FIG. 3 is a diagram of the system for the patterning the substrate in accordance with the one embodiment of the present invention.

To more clearly describe the system for providing a pattern for conductive circuit lines, refer now to FIG. 3, which shows a block diagram of the process with associated apparatus for providing the pattern in accordance with the present invention.

The process starts with a substrate having a metallic layer bonded to the surface thereof. This metallic layer may be applied as follows: a catalyst, e.g., $SnCl_2$, is applied to the surface of the substrate 17, for example by spray 102. Thereafter, a precious metal is deposited on the catalyst covered regions of the surfaces. For example, palladium may be deposited by applying $PdCl_2$ to the catalyst covered surface via bath 104. Next, the electroless deposition of a conductive layer occurs by placing the substrate 17 in a bath 106 of the conductive metal. The substrate 17 is then heated in an oven 108 for a predetermined time and to a predetermined temperature to form an oxide layer thereon.

The regions of substrate 17 which are to retain the metallic layer are then optically masked by mask 13. Thereafter, the excimer laser 11 ablates he metal layer and the oxide layer in the non-masked portions of the substrate to produce a predetermined circuit pattern. Because the surface of the oxide layer is substantially non-reflective, the ablative laser process can remove the material in a predetermined pattern of the mask 13 more efficiently than previous processes. Hence, this oxide-forming step improves the overall processing time of the patterned substrate.

The ablative laser beam ejects residue at the substrate/metal interface. The residue, as before mentioned, lands directly on the oxide layer covering the substrate 17 in the non-ablated areas. The oxide layer, along with the residue, is then removed in a bath 112.

In the case of the copper oxide, as before mentioned, an aqueous $H_2SO_4$ solution is utilized to rinse the substrate and subsequently remove the oxide layer and the residue without affecting the underlying metallic copper circuit pattern. Thereafter, the electroplating of the conductive metal on the substrate can then take place, as shown by bath 114. Since there is no residue on the surface of the patterned substrate, the subsequent electrodeposition process provides a stronger, higher quality circuit pattern. As before mentioned, the process, due to the nonreflective characteristics of the oxide layer, also provides for a layer that is more easily ablated than those previously known.

It has been found that when an electroless copper layer of 150 to 350 nanometers in thickness is applied to the substrate and thereafter the substrate is heated for approximately 25 minutes at 150 degrees, then an oxide layer of approximately 100 to 200 nanometers in thickness will be formed thereon. This layer is substantially thicker than the 5 to 10 nanometer thick oxide layer which forms when a copper surface is exposured to air at room temperature. The spontaneous oxide layer formed at room temperature is inadequate for the purposes of the present invention. This oxide layer has absorptive characteristics which will generally facilitate the explosive removal of the conductive layer by the ablative laser beam in the predetermined pattern. The copper oxide layer can then be removed by placing the substrate in an aqueous $H_2SO_4$ solution. As is well known, the $H_2SO_4$ solution will not affect the underlying copper pattern.

Figure 4:
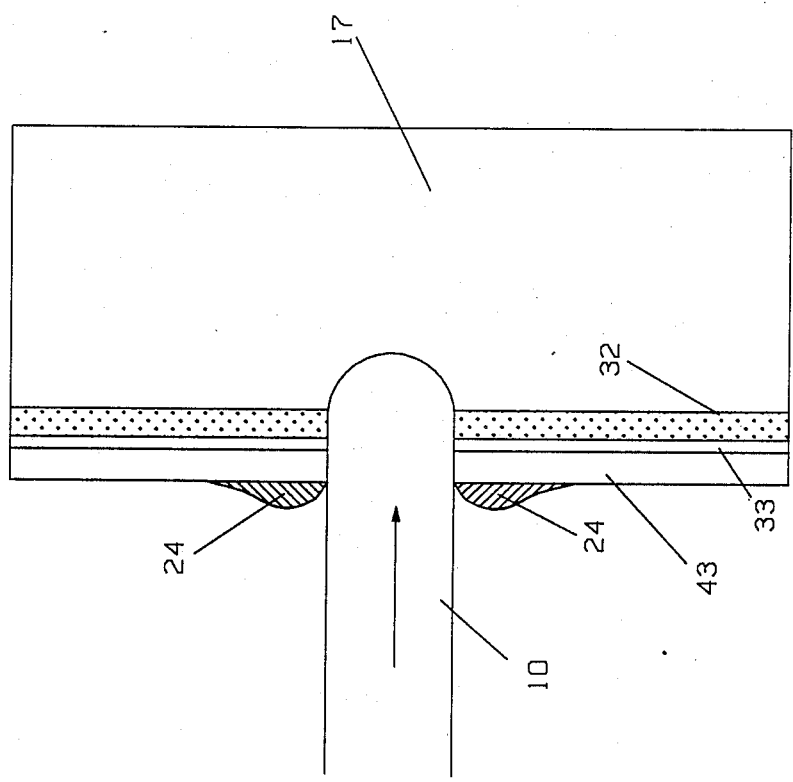
FIG. 4 is a cross-sectional side view of a substrate patterned in accordance with a second embodiment of the present invention.

Referring now to FIG. 4, in another embodiment of the present invention, it has been found that additional protection of the circuit pattern can be provided to the substrate 17. It should be noted that the thicknesses of the various layers on the substrate 17 have been exaggerated for illustrative purposes to add clarity to the following explanation.

As is seen in FIG. 4, the substrate 17 has conductive layer 32, which is preferably copper, which is covered by an oxide layer 33. The oxide layer 33 is then covered by a barrier material 43. The laser beam 10, upon hitting the interface of the substrate 17 and the electroless copper layer 32, produces the residue 24 which lands on the barrier material 43. The barrier material 43, as before mentioned, can be any substance, compound or metal that exhibits two characteristics: (1) it is as easily ablated away as the underlying metal; and, (2) it is easily removed from the substrate without affecting the underlying circuit pattern. For example, the barrier material 43 could be a metal such as aluminum, which is applied by a sputtered deposition process. The aluminum layer would thereafter be removed by a mild acid such as HCl.

The barrier material, alternatively, could be an organic material, such as Krylon TM, Dynachem TM, or polyvinylpyrroliodone. When an organic material is utilized as the barrier material, the organic material, along with the residue 24, can be removed via rinsing with an appropriate solvent which will not affect the underlying circuit pattern. For example, if Krylon TM is the barrier material 43, then acetone can be utilized to remove the barrier material 43.

Figure 5:
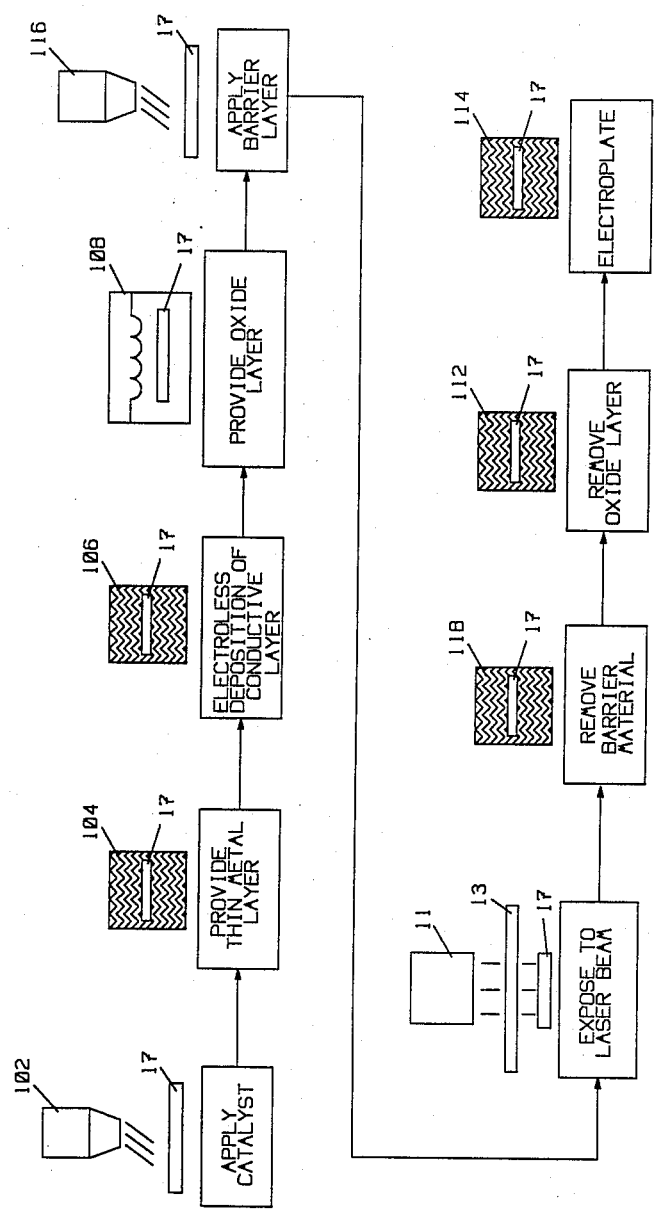
FIG. 5 is a diagram of the system for patterning the substrate in accordance with the second embodiment of the present invention.

Refer now to FIG. 5, which represents a system that provides the patterned substrate of FIG. 4. As is seen, those elements which are common to FIGS. 3 and 5 have been given common designators. Hence, the system of FIG. 5 includes a bath 116 of barrier material that is utilized to further protect the metal layer before the ablative process and also includes an additional bath 118 for the removal of the barrier material. As has been before mentioned, if the barrier material is an organic material, acetone or a like solvent can be utilized in the bath 118.

Hence, through this system, a strong conductive circuit pattern is produced. In so doing, the residue material, as before mentioned, can be rinsed away with the barrier material, and the underlying circuit pattern is relatively free from impurities. In addition, due to the non-reflective characteristics of the oxide layer on the substrate, the conductive pattern can be produced more quickly than those produced by other processes that utilize excimer lasers.

In both of the above-mentioned diagrams of FIGS. 3 and 5, the electroless conductive layer as well as the electroplated conductive lines are preferably copper. However, one of ordinary skill in the art recognizes that these conductive layers could be a variety of conductive metals, and their use would be within the spirit and scope of the present invention. For example oxides of titanium, zirconium, and chromium could provide the nonreflective qualities for the underlying metallic layer.

In summary, by heating the metal layer to a predetermined temperature for a predetermined time in the presence of oxygen, an oxide layer formed thereon. The non-reflective characteristics of the oxide layer allow for the processing time of the laser to be substantially reduced over previously known methods.

As has also been before mentioned, in previous circuit patterning methods utilizing excimer lasers, the residue produced by the ablative laser beam striking the metal/-substrate interface landed directly on the patterned surface. Hence, due to the molten nature of that residue, it would adhere to the surface and therefore adversely affect the subsequent electrodeposition process. The method and apparatus, in accordance with the present invention, provides an oxide layer on the substrate surface upon which the residue lands. In so doing the residue is removed from the substrate when the oxide layer is removed.

In addition, the present invention also uses in one embodiment a barrier material which further protects the patterned surface. By ensuring that the barrier material is of the type that can be removed by the laser process and can also be removed without affecting the underlying metal pattern, the residue can be effectively removed from the patterned substrate. Accordingly, the present invention provides for an improved method and apparatus for providing a pattern of conductive lines on a printed circuit board.

Although the present invention has been described in accordance with specific illustrative embodiments, one of ordinary skill in the art will recognize that a variety of modifications can be made to those embodiments and the modifications would be within the spirit and scope of the present invention. The scope of the present invention is defined, therefore, only by the scope of the appended claims.

What is claimed is:

1. A method for patterning a metallic layer affixed to the surface of an insulating substrate so as to remove said metallic layer in predetermined regions on said substrate surface, said method comprising the steps of:
   (a) providing an oxide layer on the surface of said metallic layer on a side opposite said substrate surface, said oxide layer being of sufficient thickness to substantially reduce the reflectivity of the surface of said metallic layer;
   (b) exposing said predetermined regions to an ablative laser beam so as to remove said metallic layer in said predetermined regions; and
   (c) removing said oxide layer.

2. The method of claim 1 wherein said step of providing an oxide layer comprises:
heating said metallic layer to a predetermined temperature for a predetermined period of time.

3. The method of claim 2 wherein said removing step comprises:
rinsing said oxide layer from said substrate surface with an aqueous acid.

4. The method of claim 3 wherein said metallic layer is copper.

5. The method of claim 4 wherein said oxide layer is copper oxide having a thickness greater than 100 nanometers.

6. A system for patterning a metallic layer affixed to the surface of an insulating substrate so as to remove said metallic layer in predetermined regions on said substrate surface, said system comprising:
   means for providing an oxide layer on the surface of said metallic layer on a side opposite said substrate surface, said oxide layer being of sufficient thickness to substantially reduce the reflectivity of the surface of said metallic layer;
   means for exposing said predetermined regions to an ablative laser beam so as to remove said metallic layer in said predetermined regions; and
   means for removing said oxide layer.

7. The system of claim 6 wherein said means for providing an oxide layer comprises an oven.

8. The system of claim 8 wherein said exposing means comprises an excimer laser.

9. The system of claim 8 wherein said removing means comprises a bath of aqueous acid.

10. The system of claim 9 wherein said excimer laser operates in the range of 180 nm to 370 nm.

11. A method for providing a metallic pattern on a substrate comprising the steps of:
   (a) applying a precious metal to said substrate surface;
   (b) depositing a metallic layer on said precious metal;
   (c) heating said metallic layer for a predetermined time at a predetermined temperature to provide an oxide layer on said metallic layer said oxide layer being of sufficient thickness to substantially reduce the reflectivity of the surface of said metallic layer;
   (d) masking said substrate in accordance with a predetermined pattern;
   (e) applying an ablative laser beam to said masked substrate; and
   (f) removing said oxide layer from said substrate.

12. The method of claim 11 wherein said oxide layer removing step comprises the step of rinsing said substrate with an aqueous acid.

13. A system for providing a metallic pattern on a substrate comprising:
   means for applying a precious metal to said substrate surface;
   means for depositing a metallic layer on said precious metal;
   means for heating said metallic layer for a predetermined time at a predetermined temperature to provide an oxide layer on said metallic layer said oxide layer being of sufficient thickness to substantially reduce the reflectivity of the surface of said metallic layer;
   means for masking said substrate in accordance with a predetermined conductive pattern;
   means for applying a laser beam to said masked substrate; and
   means for removing said oxide layer from said substrate.

14. The system of claim 13 in which said laser beam applying means comprises an excimer laser.

15. The system of claim 14 in which said excimer laser operates between the frequencies of 180 nm to 370 nm.

16. The system of claim 15 in which said removing means comprises means for rinsing said substrate with an acid.

17. A method for providing a metallic pattern on a substrate comprising the steps of:
   (a) applying a precious metal to a substrate surface;
   (b) depositing a metallic layer on said precious metal;
   (c) heating said metallic layer for a predetermined time at a predetermined temperature to form an oxide layer on said metallic layer said oxide layer being of sufficient thickness to substantially reduce the reflectivity of the surface of said metallic layer;
   (d) applying a barrier material on said metallic layer;
   (e) masking said substrate in accordance with a predetermined conductive pattern;
   (f) applying a laser beam to said masked substrate;
   (g) removing said barrier material from said substrate; and
   (h) removing said oxide layer from said substrate.

18. The method of claim 17 wherein said barrier material comprises an organic material.

19. The method claim 18 wherein said barrier material removing step comprises rinsing said organic material from said substrate surface with a solvent.

20. The method of claim 19 wherein said oxide layer removing step comprises rinsing said substrate in an aqueous acid solution.

21. A system for providing a metallic pattern on a substrate comprising:
   means for applying a precious metal to said substrate surface;
   means for depositing a metallic layer on said precious metal;
   means for heating said substrate for a predetermined time at a predetermined temperature to form an oxide layer on said metallic layer said oxide layer being of sufficient thickness to substantially reduce the reflectivity of the surface of said metallic layer;
   means for applying a barrier material on said metallic layer;
   means for masking said substrate in accordance with a predetermined conductive pattern;
   means for applying a laser beam to said masked substrate;
   means for removing said barrier material from said substrate; and
   means for removing said oxide layer from said substrate.

22. The system of claim 21 in which said barrier material comprises an organic material.

23. The system of claim 22 in which said barrier material removing means comprises means for rinsing said substrate with an organic solvent.

24. The system of claim 23 wherein said oxide layer removing means comprises an aqueous acid solution.

* * * * *

UNITED STATES PATENT AND TRADEMARK OFFICE
CERTIFICATE OF CORRECTION

PATENT NO. : 4,909,895

DATED : March 20, 1990

INVENTOR(S) : Dominic A. Cusano

It is certified that error appears in the above-identified patent and that said Letters Patent is hereby corrected as shown below:

Column 1, Line 27, delete "patter" and insert therefor --pattern--.
Column 2, Line 54, insert "." therefor after --range--.
Column 3, Line 56, delete "in" and insert therefor --on--.
Column 4, Line 23, delete "above identified" and insert therefor --above-identified--.
Column 4, Line 62, delete "oxidelayer" and insert therefor --oxide layer--.
Column 5, Line 8, delete "noneflective" and insert therefor --nonreflective--.
Column 5, Line 14, delete "he" and insert therefor --the--.
Column 7, Line 15-16, delete "i" and insert therefor --is--.
Column 11, Line 4, delete "to" and insert therefor --and--.
Column 5, Line 37, insert "of" therefor after --patterning--.
Column 8, Line 12, delete "exposured" and insert therefor --exposure--.

UNITED STATES PATENT AND TRADEMARK OFFICE
CERTIFICATE OF CORRECTION

PATENT NO. : 4,909,895

DATED : March 20, 1990

INVENTOR(S) : Dominie A. Cusano

It is certified that error appears in the above-identified patent and that said Letters Patent is hereby corrected as shown below:

Column 10, Line 27, delete "Claim 8" and insert therefor --Claim 7--.
Column 11, Line 29, insert "of" therefor after --method--.

Signed and Sealed this

Fourth Day of August, 1992

Attest:

DOUGLAS B. COMER

*Attesting Officer*   *Acting Commissioner of Patents and Trademarks*